(12) United States Patent
Toh et al.

(10) Patent No.: US 9,472,512 B1
(45) Date of Patent: Oct. 18, 2016

(54) INTEGRATED CIRCUITS WITH CONTACTS THROUGH A BURIED OXIDE LAYER AND METHODS OF PRODUCING THE SAME

(71) Applicant: GLOBALFOUNDRIES Singapore Pte. Ltd., Singapore (SG)

(72) Inventors: Rui Tze Toh, Singapore (SG); Guan Huei See, Singapore (SG); Shaoqiang Zhang, Singapore (SG); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/883,100

(22) Filed: Oct. 14, 2015

(51) Int. Cl.
| | | |
|---|---|---|
| *H01L 27/12* | (2006.01) | |
| *H01L 23/64* | (2006.01) | |
| *H01L 27/06* | (2006.01) | |
| *H01L 29/06* | (2006.01) | |
| *H01L 23/522* | (2006.01) | |
| *H01L 23/528* | (2006.01) | |
| *H01L 23/66* | (2006.01) | |
| *H01L 21/768* | (2006.01) | |

(52) U.S. Cl.
CPC ....... *H01L 23/647* (2013.01); *H01L 21/76877* (2013.01); *H01L 23/528* (2013.01); *H01L 23/5226* (2013.01); *H01L 23/66* (2013.01); *H01L 27/0629* (2013.01); *H01L 29/0649* (2013.01); *H01L 2223/6677* (2013.01)

(58) Field of Classification Search
CPC ............... H01L 23/647; H01L 23/528; H01L 23/5226; H01L 29/0649; H01L 21/76877; H01L 27/0629; H01L 23/66; H01L 2223/6677

See application file for complete search history.

(56) References Cited

U.S. PATENT DOCUMENTS

| | | | |
|---|---|---|---|
| 6,611,024 B2 | 8/2003 | Ang et al. | |
| 8,048,753 B2 * | 11/2011 | Zhou .................. | H01L 21/84 257/E21.042 |
| 2002/0093042 A1 * | 7/2002 | Oh .................... | H01L 21/28525 257/303 |
| 2005/0287718 A1 * | 12/2005 | Berndlmaier ........... | H01L 21/84 438/149 |
| 2015/0097240 A1 * | 4/2015 | Verma ............... | H01L 29/78657 257/347 |
| 2015/0303191 A1 * | 10/2015 | Feng ................. | H01L 29/66181 257/301 |
| 2015/0348945 A1 * | 12/2015 | Or-Bach ............... | H01L 21/743 257/384 |

* cited by examiner

*Primary Examiner* — Victor A Mandala
(74) *Attorney, Agent, or Firm* — Lorenz & Kopf, LLP

(57) ABSTRACT

Integrated circuits and methods of producing the same are provided. In an exemplary embodiment, an integrated circuit includes a substrate, where the substrate includes a buried oxide (BOX) layer positioned between a handle layer and a semiconductor layer. An electronic component overlies the buried oxide layer on a semiconductor layer side, and a gate line is electrically connected to the electronic component. A body line is also electrically connected to the electronic component. A first through BOX contact electrically connects the gate line with the handle layer, and a second through BOX contact electrically connects the body line with the handle layer.

20 Claims, 5 Drawing Sheets

US 9,472,512 B1

INTEGRATED CIRCUITS WITH CONTACTS THROUGH A BURIED OXIDE LAYER AND METHODS OF PRODUCING THE SAME

TECHNICAL FIELD

The technical field generally relates to integrated circuits with contacts through a buried oxide layer and methods of producing the same, and more particularly relates to integrated circuits with contacts through a buried oxide layer that protect back gate areas from damage and methods of producing the same.

BACKGROUND

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a channel of a semiconductor substrate. Spaced-apart source and drain regions are in the substrate on opposite sides of the channel, and current can flow between the source and drain within the channel. A gate insulator is disposed between the gate electrode and the channel of the semiconductor substrate to electrically isolate the gate electrode from the substrate. A control voltage applied to the gate electrode controls the flow of current through the channel between the source and drain regions.

There are many processes used in the manufacture of integrated circuits, and one of those processes that may be used is plasma induced ion bombardment. Plasma induced ion bombardment can produce an accumulation of trapped ions in a back gate area underlying a transistor gate at the interface of a semiconductor layer and a buried oxide layer (BOX layer) in a silicon-on-insulator (SOI) type substrate, especially in back end of the line processes. The SOI substrate includes a handle layer under the BOX layer. The accumulation of trapped ions produces a charge that can damage the back gate area, especially if the handle layer has a high resistivity. High resistivity handle layers can improve antenna performance in integrated circuits that use radio waves, so SOI substrates with high resistivity handle layers are employed for some integrated circuits.

Accordingly, it is desirable to provide methods of producing integrated circuits that reduce or eliminate back gate damage during plasma induced ion bombardment, and integrated circuits produced by such methods. In addition, it is desirable to provide integrated circuits that can drain a charge accumulation at the back gate area without inducing excessive currant leakage, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing the same are provided. In an exemplary embodiment, an integrated circuit includes a substrate, where the substrate includes a buried oxide (BOX) layer positioned between a handle layer and a semiconductor layer. An electronic component overlies the buried oxide layer on a semiconductor layer side, and a gate line is electrically connected to the electronic component. A body line is also electrically connected to the electronic component. A first through BOX contact electrically connects the gate line with the handle layer, and a second through BOX contact electrically connects the body line with the handle layer.

An integrated circuit is provided in another embodiment. The integrated circuit includes a substrate that includes a buried oxide (BOX) layer positioned between a handle layer and a semiconductor layer. A transistor overlies the BOX layer on a semiconductor layer side, where the transistor includes a gate and a body. A plurality of through BOX contacts are in electrical communication with the handle layer and the transistor.

A method of producing an integrated circuit is provided in yet another embodiment. The method includes forming an electronic component overlying a buried oxide layer of a substrate, where the substrate includes a handle layer and a semiconductor layer on opposite sides of the buried oxide layer. The electronic component is formed on a semiconductor layer side of the buried oxide layer. A gate line is formed in electrical communication with the electronic component, and a body line is also formed in electrical communication with the electronic component. A first through BOX contact is formed, where the first through BOX contact electrically connects the gate line with the handle layer. A second through BOX contact is formed that electrically connects the body line with the handle layer.

BRIEF DESCRIPTION OF THE DRAWINGS

The present embodiments will hereinafter be described in conjunction with the following drawing figures, wherein like numerals denote like elements, and wherein.

DETAILED DESCRIPTION

Figure 1:
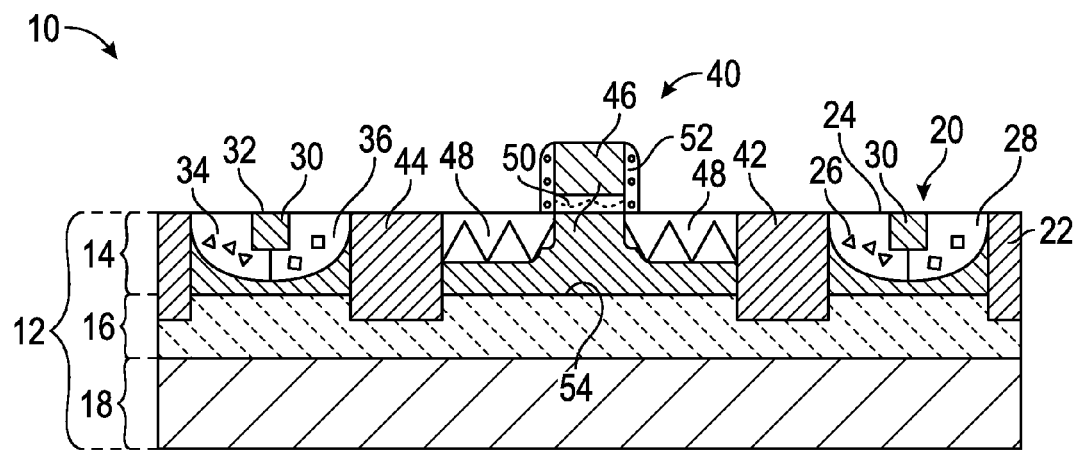
FIGS. 1-6 are cross-sectional views illustrating portions of an integrated circuit and methods for its fabrication in accordance with exemplary embodiments.

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

An electronic component formed on and/or in a silicon-on-insulator substrate is connected to a gate line and a body line. Each of the gate line and the body line are separately connected to a handle layer of the silicon-on-insulator substrate to protect the back gate area from damage during ion bombardment. Reference is made to an exemplary embodiment in FIG. 1 to clarify details and specifics. The integrated circuit 10 includes a substrate 12, wherein the substrate is a silicon-on-insulator (SOI) substrate 12. The substrate 12 includes a semiconductor layer 14 overlying a buried oxide layer 16 that in turn overlies a handle layer 18. As used herein, the term "overlying" means "over" such that an intervening layer may lie between the semiconductor layer 14 and the buried oxide layer 16, and "on" such that the semiconductor layer 14 physically contacts the buried oxide layer 16. In many embodiments, the semiconductor layer 14 does physically contact the buried oxide layer 16, and the buried oxide layer 16 physically contacts the handle layer 18 such that the buried oxide layer 16 is positioned between the semiconductor layer 14 and the handle layer 18. As used herein, the "semiconductor layer side" of the substrate 12 refers to the side of the substrate 12 that includes the semiconductor layer 14, and not the side of the substrate 12 that includes the handle layer 18.

In an embodiment, the semiconductor layer 14 includes semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is monocrystalline silicon.

The buried oxide (BOX) layer 16 includes an electrically insulating material. As used herein, an "electrically insulating material" is a material with a resistivity of about $1 \times 10^4$ ohm meters or more, and an "electrically conductive material" is a material with a resistivity of about $1 \times 10^{-4}$ ohm meters or less. In some embodiments the BOX layer 16 includes silicon dioxide, but other insulating materials may be included in alternate embodiments. The handle layer 18 includes monocrystalline silicon in some embodiments. In an exemplary embodiment, the handle layer 18 has a low concentration of conductivity-imparting ions such that the handle layer 18 has a resistivity of 1,000 ohm centimeters or more. The handle layer 18 may improve antenna performance in some embodiments for radio wave (or other forms of electromagnetic radiation) transmission and/or reception, and a resistivity of 1,000 ohms centimeters or more may provide better performance than a handle layer with a lower resistivity. However, the higher resistivity of the handle layer 18 has a tendency to increase the likelihood of back gate damage during ion bombardment.

In some embodiments, the substrate 12 is supplied in a disc (not illustrated), where the disc has a diameter of about 28 centimeters or more. SOI substrates are commercially available with different diameters. An SOI substrate 12 with a larger diameter, such as a diameter of about 28 centimeters or more, also increases the likelihood of back gate damage during ion bombardment. In some embodiments, the etch power is increased for larger wafer sizes to maintain the same or similar etch timings as for smaller wafers. As such, the plasma exposure may be significantly increased with larger wafer sizes.

The semiconductor layer 14 is divided into a plurality of "islands" 20 that are surrounded by shallow trench isolation structures 22, 42, 44. The shallow trench isolation structures 22, 42, 44 pass completely through the semiconductor layer 14 and physically contact the BOX layer 16. In the embodiment illustrated, the shallow trench isolation structure 22 penetrates a short distance into the BOX layer 16. The shallow trench isolation structures 22 include an electrical insulator, such as silicon dioxide, so each individual island 20 is electrically isolated from the other islands 20 by the BOX layer 16 underneath and the shallow trench isolation structures 22 on the sides. An integrated circuit 10 is formed overlying the substrate 12 and the islands 20 such that components on different islands 20 may become electrically connected within the integrated circuit 10, as described below.

An optional first diode 24 includes a first diode P section 26 and a first diode N section 28. The first diode P section 26 includes "P" type conductivity imparting ions, where "P" type conductivity determining ions include boron, aluminum, gallium, and indium, but other materials or combinations of materials can also be used. The first diode N section 28 includes "N" type conductivity imparting ions, where "N" type conductivity-determining ions include arsenic or phosphorous, but antimony, other materials, or combinations thereof can also be used. In the exemplary first diode 24 illustrated, the first diode P and N sections 26, 28 are within the semiconductor layer 14, so the first diode P and N sections 26, 28 include monocrystalline silicon doped with the associated conductivity imparting ions. The first diode P and N sections 26, 28 may physically contact each other underlying a diode barrier 30. The diode barrier 30 includes an insulating material, such as silicon dioxide, and can help prevent a short at the surface of the first diode 24. In some embodiments, an electrically conductive silicide is formed at the surface of the first diode 24 (described more fully below), and this silicide can short the first diode 24 if the diode barrier 30 is not present. It is to be appreciated that there are other types of structures that can be used as a diode in alternate embodiments.

An optional second diode 32 can be the same as or different than the first diode 24, and in the embodiment illustrated in FIG. 1 the second diode 32 is the same as the first diode 24. As such, the second diode 32 includes a second diode N section 34, a second diode P section 36 and a diode barrier 30, as described for the first diode 24 above. The second diode 32 may be positioned in a different island 20 from the first diode 24, so the first and second diodes 24, 32 are electrically isolated.

An electronic component 40 is positioned in and/or on an island 20 between a first shallow trench isolation structure 42 and a second shallow trench isolation structure 44. The electronic component 40 overlies the BOX layer 16 on a semiconductor layer side, which is the side opposite of the handle layer 18. In some embodiments, the electronic component 40 may include parts formed from the semiconductor layer 14, and in other embodiments the electronic component 40 may be formed completely overlying the semiconductor layer 14. The electronic component 40 is a planar MOSFET transistor in the embodiment illustrated. However, the electronic component 40 may be a wide variety of components in alternate embodiments, including but not limited to various types of transistors (e.g., finned transistors, metal oxide semiconductor field effect transistors (MOSFET); complementary metal oxide semiconductor (CMOS) transistors; bipolar junction transistors (BJT); high voltage transistors; high frequency transistors; p-channel and/or n-channel field effect transistors (PFETs/NFETs); etc.); resistors; diodes; capacitors; inductors; and fuses. The illustrated transistor includes a gate 46, a source and drain (jointly indicated by reference number 48), a gate insulator 50, and spacers 52. In an exemplary embodiment, the gate 46 includes conductive polysilicon, the gate insulator 50 and the spacers 52 include electrically insulating materials, such as silicon dioxide or silicon nitride, and the source/drain 48 are monocrystalline silicon doped with N type conductivity determining ions. The back gate area 54 is the area near the intersection of the semiconductor layer 14 and the BOX layer 16 that directly underlies the gate 46. As used herein, the term "directly overlying" or "directly underlying" means a vertical line passing through the upper component (the gate) also passes through the lower component or area (the back gate area), such that at least a portion of the upper component is directly over at least a portion of the lower component. It is understood that the integrated circuit 10 may be moved such that the relative "up" and "down" positions change, so reference to a "vertical" line means a line that is about perpendicular to the surface of the BOX layer 16. The electronic component 40 is in a separate island 20 from the first and the second diode 24, 32, so the electronic component 40 is electrically isolated from the first and second diodes 24, 32.

Figure 2:
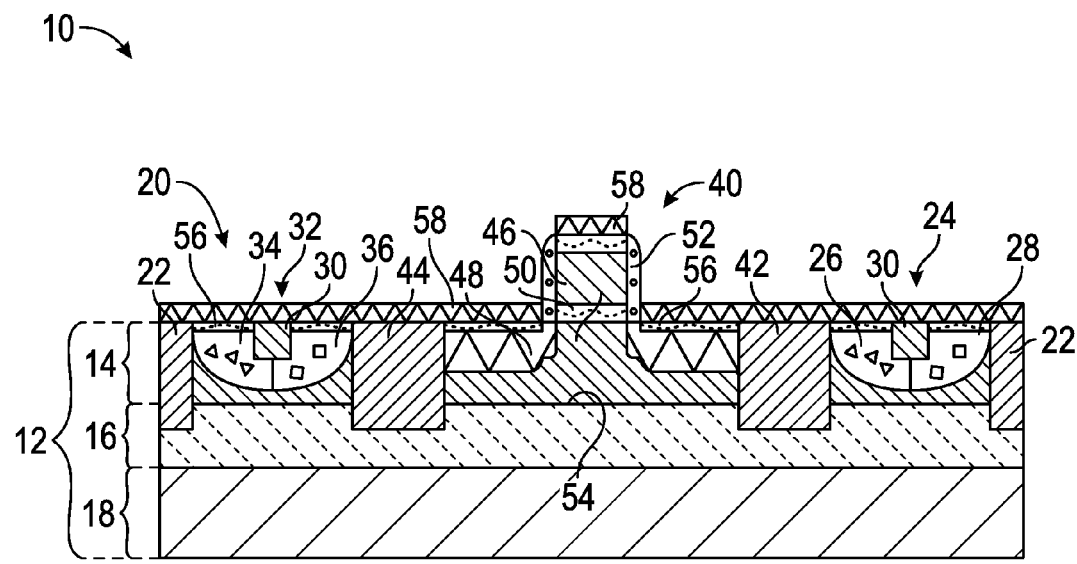

Referring to the exemplary embodiment illustrated in FIG. 2, the exposed silicon portions of the semiconductor layer 14 are silicided. A thin layer of metal is deposited on the exposed surfaces, such as by sputtering or chemical vapor deposition, and the silicide 56 is formed by a subsequent anneal. In an exemplary embodiment, nickel (Ni) is deposited and then annealed at a first temperature of about 240 degrees centigrade (° C.) to about 320° C. for about 10 to about 40 seconds, followed by a second anneal at about 400° C. to about 500° C. for about 20 to about 40 seconds. Other metals can be used, and the annealing process is adjusted for the selected metal. A wet etch is then used to selectively remove the nickel overburden, which does not react with materials other than silicon. For example, nickel can be selectively etched with a mixture of nitric acid, acetic acid, and sulfuric acid. As such, the silicide 56 is present on the surface of the first and second diode 24, 32, the top surface of the gate 46, and the surface of the source and drain 48, but no silicide 56 is present on the spacers 52 or the shallow trench isolation structures 22 (which include the first and second shallow trench isolation structures 42, 44).

In some embodiments, a base etch stop layer 58 is formed overlying the silicide 56 and the shallow trench isolation structures 22. The base etch stop layer 58 (and other etch stop layers mentioned or described below) is formed to enable selective etching, so the material of the base etch stop layer 58 can be varied depending on the desired etch selectivity and the materials being etched. In an exemplary embodiment, the base etch stop layer 58 includes silicon oxynitride, silicon nitride, or stacked layers of silicon oxynitride and silicon nitride. Silicon nitride can be formed by low pressure chemical vapor deposition using ammonia and dichlorosilane, and silicon oxynitride can be formed by plasma enhanced chemical vapor deposition using nitrous oxide and silane.

Figure 3:
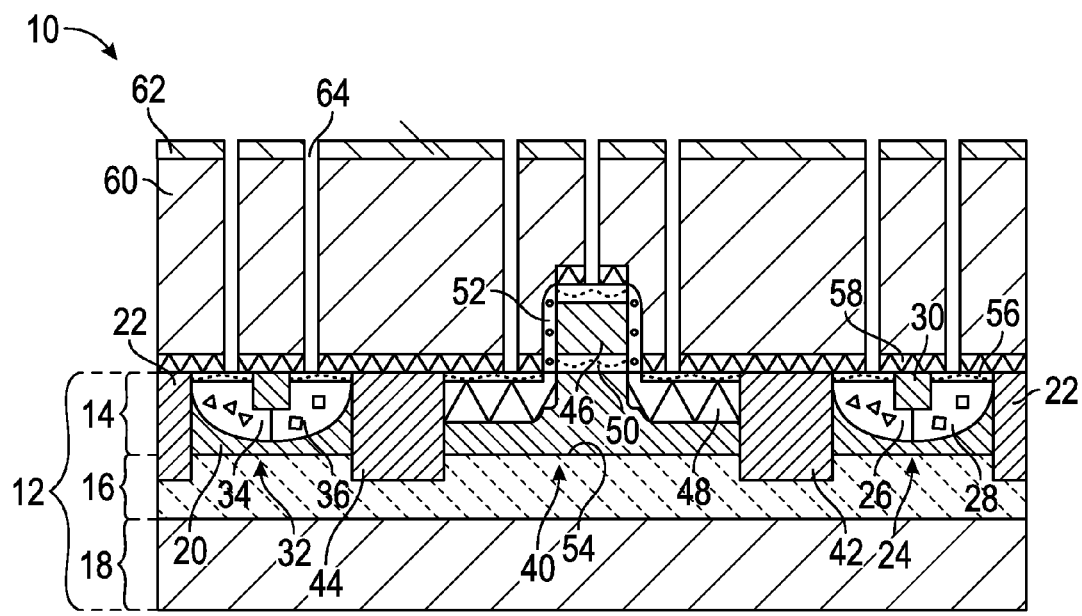

Referring to FIG. 3, a first interlayer dielectric 60 is formed overlying the base etch stop layer 58. In an exemplary embodiment the first interlayer dielectric 60 is silicon dioxide, which can be formed by chemical vapor deposition using silane and oxygen. However, there are several ways to form silicon dioxide, and many other electrically insulating materials may be used for the first interlayer dielectric 60 in alternate embodiments. The material of the first interlayer dielectric 60 should allow for selective etching in relation to the base etch stop layer 58.

A first contact photoresist layer 62 is formed and patterned overlying the first interlayer dielectric 60. The first contact photoresist layer 62 (and other photoresist layers described below) is deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations are removed with an organic solvent, and the first contact photoresist layer 62 remains overlying the other areas of the first interlayer dielectric 60. The first contact photoresist layer 62 (and other photoresist layers described below) may optionally include a top and/or bottom anti-reflective coating (not illustrated) and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane.

The first contact photoresist layer 62 (and any optional anti-reflective coatings or hard masks) are used to expose selected areas of the first interlayer dielectric 60. The exposed areas are removed, such as with a reactive ion etch using $C_4F_8H_2$ (octafluoro butane) and carbon monoxide, to produce a first contact via 64. The base etch stop layer 58 is then removed within the first contact via 64, such as with a reactive ion etch using carbon tetrafluoride, to extend the first contact via 64 to the silicide 56. The first contact photoresist layer 62 (and any associated antireflective layers or hard masks, although not illustrated) can be selectively removed, where the photoresist can be selectively removed with an oxygen containing plasma.

Figure 4:
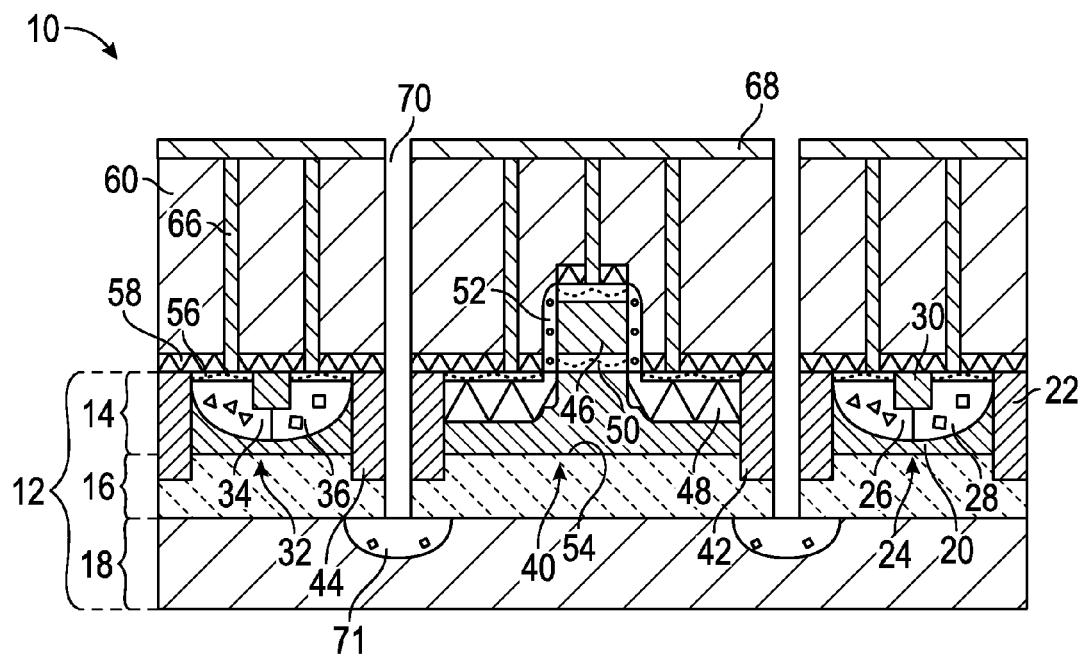

The first contact vias 64 are filled to form first contacts 66, as illustrated in an exemplary embodiment in FIG. 4 with continuing reference to FIG. 3. In an exemplary embodiment, the first contacts 66 include an adhesion layer, a barrier layer, and a plug (not individually illustrated), which are sequentially deposited. For example, an adhesion layer of titanium is formed by low pressure chemical vapor deposition using titanium pentachloride, a barrier layer of titanium nitride is formed by chemical vapor deposition using titanium tetrabromide and ammonia, and a plug of tungsten is formed by chemical vapor deposition using tungsten hexafluoride and hydrogen. Other types of contacts are also possible, such as copper or other conductive materials. Overburden can then be removed, such as with chemical mechanical planarization.

A BOX photoresist layer 68 is formed and patterned overlying the first contacts 66 and the first interlayer dielectric 60. The BOX photoresist layer 68 is patterned to expose portions of the first interlayer dielectric 60 that directly overlie the first and second shallow trench isolation structures 42, 44. A BOX via 70 is then formed through the first interlayer dielectric 60, the base etch stop layer 58, the first and second shallow trench isolation structures 42, 44 (respectively), and the buried oxide (BOX) layer 16. In some embodiments, the first and second shallow trench isolation structures 42, 44 have a larger diameter than some other shallow trench isolation structures 22 to accommodate the BOX via 70, such that a portion of the first and second shallow trench isolation structures 42, 44 remain around the BOX via 70. As such, the BOX via 70 does not expose the semiconductor layer 14, such that the semiconductor layer 14 does not define any portion of the BOX via 70. The first and second shallow trench isolation structures 42, 44 are illustrated adjacent to the island 20 with the electronic component 40, however in alternate embodiments the first and second shallow trench isolation structures 42, 44 (and the BOX vias 70) are not adjacent to the island 20 with the electronic component 40.

Figure 5:
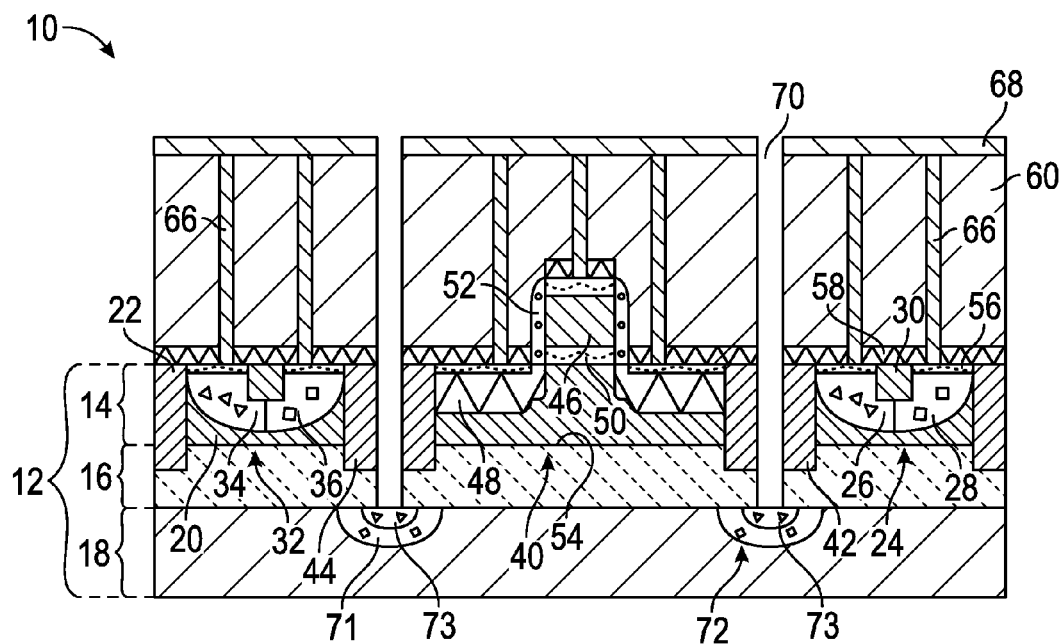

The handle layer 18 is then optionally implanted with conductivity determining ions through the BOX via 70 to form a first doped handle area 71, such as with an ion source and electrostatic acceleration. In the illustrated embodiment, the handle layer 18 is implanted with P type conductivity determining ions to a depth that varies with design requirements. In an exemplary embodiment, the implant depth is about 0.5 microns from the surface of the handle layer 18 exposed through the BOX via 70 to form the first doped handle area 71. The handle layer 18 may then be implanted with N type conductivity determining ions through the BOX via 70 to a depth of about 0.1 or about 0.2 microns to form a second doped handle area 73, as illustrated in FIG. 5. Other depths or other types of ions are used in alternate embodiments. The first and second doped handle areas 71, 73 produce a handle layer diode 72 formed by monocrystalline silicon with adjacent N and P type regions. The order of the N and P type regions can be changed or varied by modifying the ions implanted. The relative position of the N and P type regions for the handle layer diodes 72 can be varied within a single integrated circuit 10 by isolating one BOX via 70 while implanting another, such as with photoresist. In some embodiments, only one type of conductivity determining ion is implanted in the handle layer 18 through the BOX via 70, so the second doped handle area 73 illustrated in FIG. 5 may be omitted. In this embodiment, the first doped handle area 71 is implanted with one type or family of conductivity determining ions, so no handle layer diode 72 is formed. The implanted conductivity imparting ions can improve an electrical connection with the handle layer 18 underlying the BOX via 70. The handle layer 18 may then be annealed. The annealing process can use widely varying temperatures, such as temperatures ranging from about 500° C. to about 1,200° C.

Figure 6:
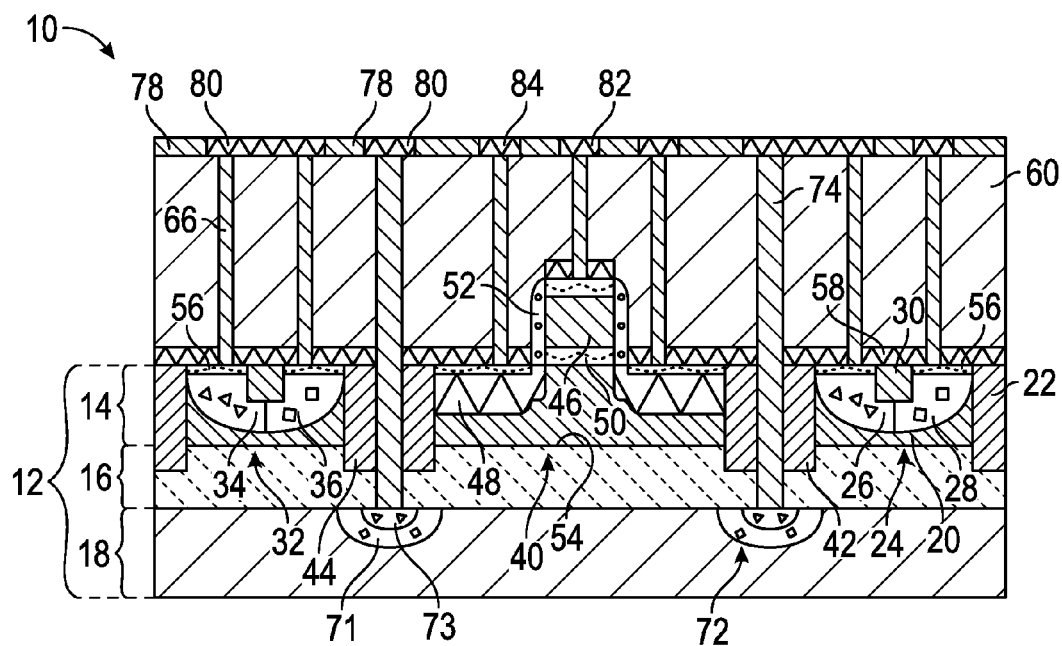

Referring to the exemplary embodiment in FIG. 6, with continuing reference to FIG. 5, the BOX vias 70 are filled with a first through BOX contact 74 and a second through BOX contact 76. The first and second through BOX contacts 74, 76 may be formed in the same manner as the first contacts 66 described above. As such, the first through BOX contact 74 passes through the first shallow trench isolation structure 42 and the second through BOX contact 76 passes through the second shallow trench isolation structure 44. A second interlayer dielectric 78 is then formed overlying the first interlayer dielectric 60, the first contacts 66, and the first and second through BOX contacts 74, 76. In an exemplary embodiment, the second interlayer dielectric 78 includes silicon dioxide, but other electrically insulating materials can be used in alternate embodiments.

A plurality of interconnects 80 are formed in the second interlayer dielectric 78, where the interconnects 80 include a gate line 82 and a body line 84. The gate line 82 and the body line 84 are electrically connected to the electronic component 40, but the gate line 82 and the body line 84 are not directly connected together. In the illustrated embodiment, the gate line 82 is electrically connected to the gate 46, and the body line 84 is directly connected to the source/drain 48. In an exemplary embodiment, the interconnects 80 are formed from copper, which can be deposited using a damascene process by forming a trench, depositing copper by electroless or electrolytic plating from a solution such as a sulfuric acid copper bath, and subsequent chemical mechanical planarization to remove the copper overburden. The interconnects 80 may include the same or different materials relative to the first contacts 66 and/or the first and second through BOX contacts 74, 76 in various embodiments, as long as these components are conductive materials.

Figure 7:
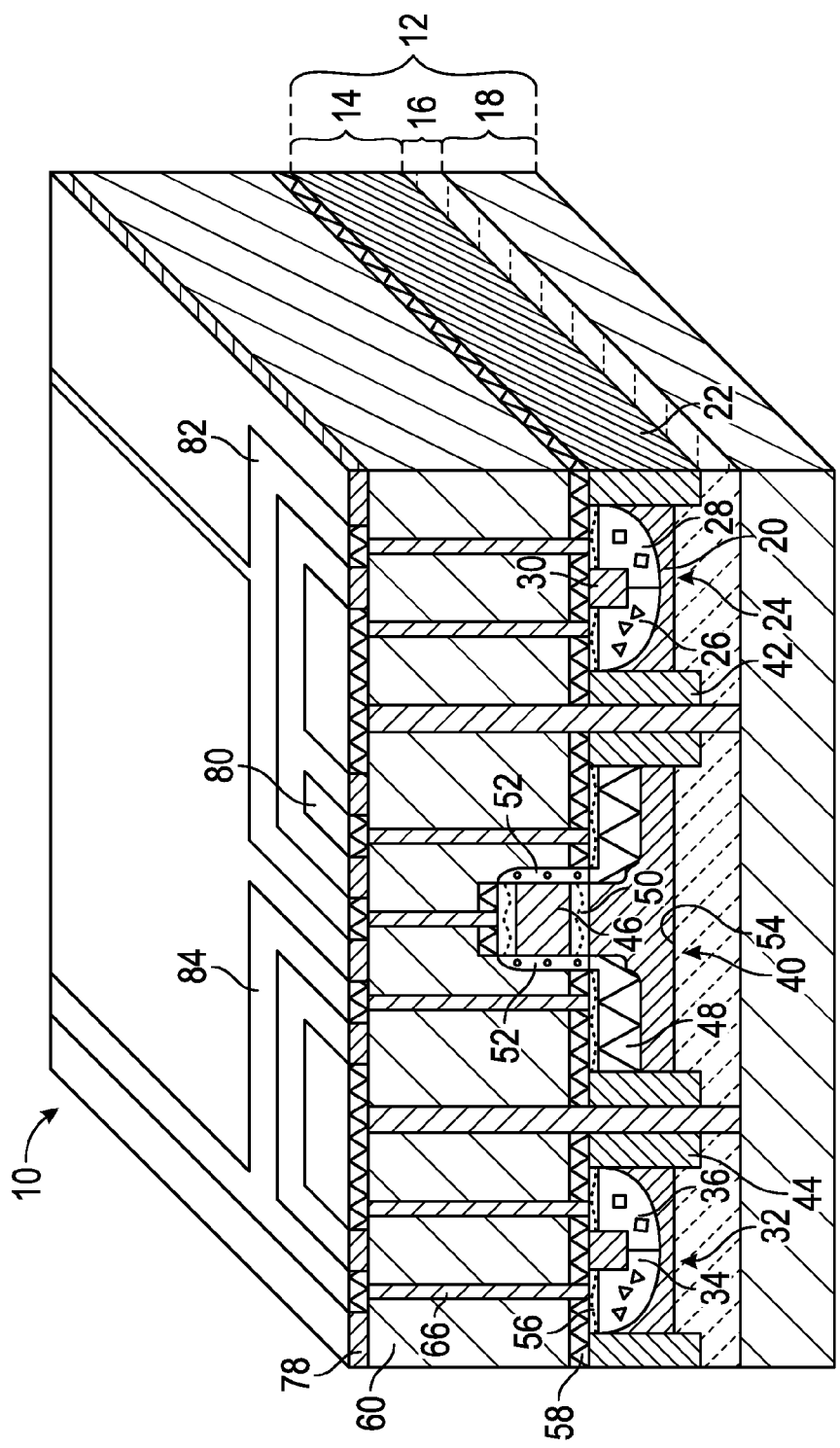
FIG. 7 is a perspective sectional view of one embodiment illustrating portions of an integrated circuit and a method for its fabrication.

Reference is now made to an exemplary embodiment illustrated in FIG. 7. In this embodiment, the first diode 24 is electrically connected to the gate line 82 and the gate 46 of the electronic component 40, as well as being electrically connected to the handle layer 18 by way of the first through BOX contact 74. The second diode 32 is electrically connected to body line 84 and the source/drain 48 of the electronic component 40, as well as being electrically connected to the handle layer 18 by way of the second through BOX contact 76. In some embodiments, the source/drain 48 and the body line 84 are referred to as a body side of the integrated circuit 10, and the gate line 82 and the gate 46 are referred to as the gate side of the integrated circuit 10. The electronic component 40 is electrically connected to the handle layer 18 by two separate, electrically isolated lines, where one of the lines is on the gate side and the other line is on the body side.

The handle layer 18 may have a high resistivity, as mentioned above, so the first and second through BOX contacts 74, 78 are not electrically connected through the handle layer 18. As such, the first and second through BOX contacts 74, 76 may be spaced a set distance apart from each other to prevent or minimize leakage between the two through the handle layer 18. For example, the first and second through BOX contacts 74, 76 may be about 1 micrometer or more away from each other, or about 10 micrometers or more away from each other, or about 20 micrometers or more away from each other, or about 50 micrometers or more away from each other, or about 100 micrometers or more away from each other in various embodiments. The distance may depend on the product leakage specification, resistivity of the handle layer, or other factors.

The first and second through BOX contacts 74, 76 as described above are one embodiment of separate, electrically isolated lines, but other embodiments are also possible. For example, other forms or types of electrical conductors can be produced that connect the electronic component 40 to the handle layer 18 through the BOX layer 16. Alternatively, an electrical connection could be produced around an edge of the BOX layer 16 without passing through the BOX layer 16.

It has been discovered that the back gate area 54 is better protected from damage when the electronic component 40 is connected to the handle layer 18 by two separate, electrically isolated lines, as described above. The two separate, electrically isolated lines allow damage-free drainage of the electrical charge that can build up in the back gate area 54 during some processes, such as ion bombardment during back end of the line processes. If only one line electrically connects the electronic component 40 to the handle layer 18, the back gate area 54 may be damaged at a much higher rate than with two electrically isolated lines; one on the gate side and the other on the body side.

Figure 8:
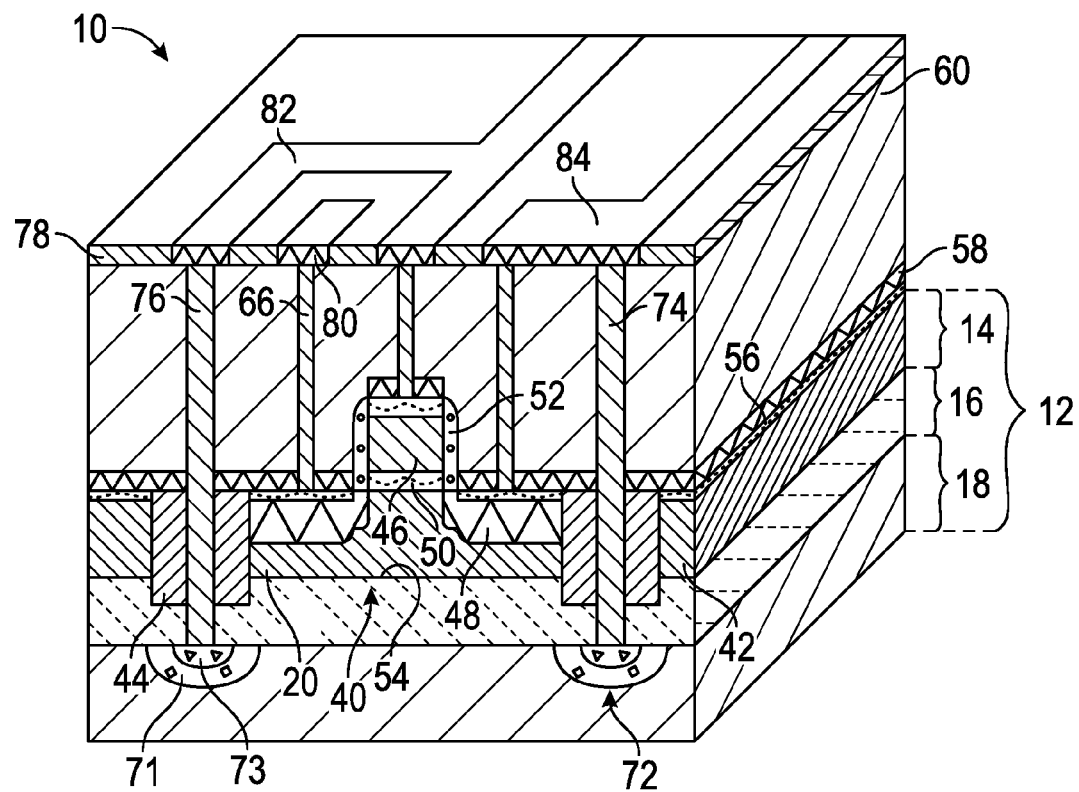
FIG. 8 is a perspective sectional view of an alternate embodiment illustrating portions of an integrated circuit and a method for its fabrication.

As seen in FIG. 7, the first and second diodes 24, 32 are present in the semiconductor layer 14, but the handle layer diodes 72 are not present in the handle layer 18. FIG. 8 illustrates an alternate embodiment with the handle layer diode 72 present in the handle layer 18, but the first and second diodes 24, 32 in the semiconductor layer 14 are not present. A diode may optionally be positioned in one or both of the separate electrical paths between the electronic component 40 and the handle layer 18 to reduce or eliminate current leakage, but there is little purpose to including two diodes in one of the electrical paths. Two diodes are shown in FIG. 6 to illustrate different methods and structures that can be used for the diode, and there may be two diodes present in a single electrical path in some embodiments, but two diodes in one electrical path are generally not needed.

The gate line 82 and the body line 84 can be electrically connected to the handle layer 18 without any diodes present in the electrical path in some embodiments. There may be some current leakage, but if the distance between the first and second through BOX contacts 74, 76 is large enough, the current leakage will be negligible, such as less than about 10 percent, or less than about 5 percent, or less than about 1 percent or less in various embodiments, where the percentage is based on the total current flowing to the electronic component 40. Appropriate distances between the first and second through BOX contacts 74, 76 were discussed above.

The first doped handle area 71 may improve the electrical communication between the handle layer 18 and the first and/or second through BOX contact 74, 76, as mentioned above. The first doped handle area 71 may not be a diode in this embodiment, so the implanted conductivity imparting ions would resemble the form illustrated in FIG. 4, where only one type of conductivity imparting ion has been implanted into the handle layer 18.

In some embodiments, the gate line 82 may include an electrical connection to one or a limited number of first through BOX contacts 74 and an electrical connection to a plurality of electronic components 40, where there are more electronic components 40 than first through BOX contacts 74. In a similar manner, the body line 84 may be electrically connected to more electronic components 40 than second through BOX contacts 76. The electrical resistance of the path from the electronic component 40 to the handle layer 18 should be less than a set value, but many electronic components 40 can be protected by far fewer first and second through BOX contacts 74, 76. A single diode should also adequately reduce leakage for each first or second through BOX contact 74, 76, so separate diodes for each electronic component 40 may not be needed.

The illustrated embodiment depicts a metal-oxide-semiconductor (MOS) transistor as the electronic component. However, the same concept may be applied at a circuit level. For example, if there is a circuit with a gate/body line 82, 84 electrically connected to a series of transistors, a through BOX contact at the gate line 82 and another through BOX contact at the body line 84 may suffice to protect the back gate area 54 or other areas of the semiconductor layer 14. The fundamental concepts described above may be applied at a device level, as illustrated, but the fundamental concepts may also be applied to a more complicated electrical device such as a circuit.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a substrate comprising a handle layer, a buried oxide (BOX) layer, and a semiconductor layer, wherein the buried oxide layer is positioned between the handle layer and the semiconductor layer;
   an electronic component overlying the buried oxide layer on a semiconductor layer side of the buried oxide layer;
   a gate line electrically connected to the electronic component;
   a body line electrically connected to the electronic component;
   a first through BOX contact electrically connecting the gate line with the handle layer; and
   a second through BOX contact electrically connecting the body line with the handle layer.

2. The integrated circuit of claim 1 further comprising:
   a first shallow trench isolation structure within the semiconductor layer, wherein the first through BOX contact passes through the first shallow trench isolation structure.

3. The integrated circuit of claim 1 further comprising:
   a second shallow trench isolation structure within the semiconductor layer, wherein the second through BOX contact passes through the second shallow trench isolation structure.

4. The integrated circuit of claim 1 further comprising:
   a first diode, wherein the first diode is electrically connected between the gate line and the first through BOX contact.

5. The integrated circuit of claim 4 wherein a shallow trench isolation structure is positioned within the semiconductor layer between the first diode and the electronic component.

6. The integrated circuit of claim 4 wherein:
   the first diode comprises a first diode N section electrically connected to the gate line;
   the first diode comprises a first diode P section electrically connected to the handle layer, and wherein the first diode N section physically contacts the first diode P section.

7. The integrated circuit of claim 1 further comprising:
   A second diode, wherein the second diode is electrically connected between the body line and the second through BOX contact.

8. The integrated circuit of claim 7 wherein a shallow trench isolation structure is positioned within the semiconductor layer between the second diode and the electronic component.

9. The integrated circuit of claim 7 wherein:
   the second diode comprises a second diode N section electrically connected to the body line; and
   the second diode comprises a second diode P section electrically connected to the handle layer, and wherein the second diode P section physically contacts the second diode N section.

10. The integrated circuit of claim 1 wherein the first through BOX contact is electrically isolated from the second through BOX contact.

11. The integrated circuit of claim 1 wherein the handle layer has a resistivity of about 1,000 ohm centimeters or greater.

12. The integrated circuit of claim 1 further comprising:
a handle layer diode within the handle layer, wherein the handle layer diode is positioned within the handle layer, and wherein the handle layer diode is electrically connected to at least one of the first through BOX contact and the second through BOX contact.

13. The integrated circuit of claim 1 wherein the first through BOX contact and the second through BOX contact are about 10 micrometers or more apart.

14. The integrated circuit of claim 1 wherein the electronic component comprises a planar transistor.

15. The integrated circuit of claim 1 wherein:
the electronic component comprises a transistor, wherein the transistor comprises a gate and a body, and wherein the body comprises a source and a drain.

16. The integrated circuit of claim 15 wherein:
the gate is electrically connected to the gate line; and
the body is electrically connected to the body line.

17. An integrated circuit comprising:
a substrate comprising a handle layer, a buried oxide layer, and a semiconductor layer, wherein the buried oxide layer is positioned between the handle layer and the semiconductor layer;
a transistor overlying the buried oxide layer on a semiconductor layer side of the buried oxide layer, wherein the transistor comprises a gate and a body; and
a plurality of through BOX contacts in electrical communication with the handle layer and the transistor.

18. The integrated circuit of claim 17 wherein the handle layer comprises a resistivity of about 1,000 ohm centimeters or greater.

19. The integrated circuit of claim 17 wherein the transistor comprises a planar transistor.

20. A method of producing an integrated circuit comprising:
forming an electronic component overlying a buried oxide layer of a substrate, wherein the substrate comprises a handle layer and a semiconductor layer on opposite sides of the buried oxide layer, and wherein the electronic component is formed on a semiconductor layer side of the buried oxide layer;
forming a gate line electrically connected to the electronic component;
forming a body line electrically connected to the electronic component;
forming a first through BOX contact electrically connecting the gate line with the handle layer; and
forming a second through BOX contact electrically connecting the body line with the handle layer.

* * * * *